United States Patent
Wen (10) Patent No.: US 8,860,434 B2
(45) Date of Patent: Oct. 14, 2014

(54) METHOD OF MEASURING SCATTERING PARAMETERS OF DEVICE UNDER TEST

(75) Inventor: Sheng-Yu Wen, New Taipei (TW)

(73) Assignee: Wistron Corp., New Taipei (TW)

(*) Notice: Subject to any disclaimer, the term of this patent is extended or adjusted under 35 U.S.C. 154(b) by 206 days.

(21) Appl. No.: 13/481,842

(22) Filed: May 27, 2012

(65) Prior Publication Data

US 2012/0326737 A1  Dec. 27, 2012

(30) Foreign Application Priority Data

Jun. 22, 2011  (TW) .............. 100121811 A (51) Int. Cl.
- *G01R 27/04* (2006.01)
- *G01R 35/00* (2006.01)
- *G01R 27/32* (2006.01)

(52) U.S. Cl.
CPC .............. *G01R 35/005* (2013.01); *G01R 27/32* (2013.01)
USPC ........................................ 324/638; 324/601

(58) Field of Classification Search
CPC .............. G01R 35/005; G01R 27/32
USPC ................................. 324/638, 601
See application file for complete search history.

(56) References Cited

U.S. PATENT DOCUMENTS

| | | | |
|---|---|---|---|
| 6,147,501 A | 11/2000 | Chodora | |
| 6,188,968 B1* | 2/2001 | Blackham | 702/85 |
| 6,300,775 B1 | 10/2001 | Peach et al. | |
| 7,064,555 B2* | 6/2006 | Jamneala et al. | 324/601 |
| 7,068,049 B2* | 6/2006 | Adamian | 324/638 |
| 2009/0184721 A1 | 7/2009 | Albert-Lebrun et al. | |

OTHER PUBLICATIONS

China Patent Office, Office action issued on Apr. 2, 2014.
Taiwan Patent Office, Office action issued on Jun. 4, 2014.

* cited by examiner

*Primary Examiner* — Arleen M Vazquez
*Assistant Examiner* — Alesa Allgood
(74) *Attorney, Agent, or Firm* — Li & Cai Intellectual Property (USA) Office (57) ABSTRACT

A method of measuring scattering parameters (S-parameters) of a device under test (DUT) is provided in the present disclosure. The S-parameters of the DUT with two connectors of different standards may be obtained without performing a full two-port calibration using an adapter kit. Two one-port calibrations are performed in the present disclosure to build two error models, the first one of which includes the characteristics of one-port of a network analyzer and a cable, the second one of which further includes the characteristics of the DUT. Therefore, the characteristics of the DUT may be obtained by removing the characteristics of the first error model from the second error model.

9 Claims, 5 Drawing Sheets

METHOD OF MEASURING SCATTERING PARAMETERS OF DEVICE UNDER TEST

BACKGROUND

1. Technical Field

The present disclosure relates to a method for measuring the scattering parameters (S-parameters) of an adapter, in particular, to a method for measuring the S-parameters of an adapter with a network analyzer.

2. Description of Related Art

As the operation frequency of the electronic circuitry becoming increasingly high, the complexities of the characteristics associated with the electronics components increase. Furthermore the inductance and the capacitance associated with routing or parasitic effects of components become prominent along with the increasing of the operating frequency. In practice, the characteristics of electronic components below the very high frequency (VHS, 30-300 MHz) may be obtained via the multimeter. However, the characteristics of the electronic components at higher operating frequency must be obtained using high frequency measuring instruments.

The most commonly used high frequency measuring instrument is the network analyzer, which may be used for measuring the scattering parameters (S-parameters) of the electronic components or the device under tests (DUTs). The network analyzer may analyze the characteristics of the DUTs through measuring the S-parameters (including the reflected coefficient and the transmitted coefficient) of the DUTs at various frequencies. In general, the most commonly seen network analyzer is the Vector Network Analyzer (VNA).

When performing high frequency circuit measurements, usage of various types of adapters are often required, in which these adapters are used for connecting connectors of different standards, for example N-type to 3.5 mm, 3.5 mm to 2.4 mm, or ground signal ground (GSG) of wafer measurement to 3.5 mm. Since these adapters with two-connector-end having different standards, two sets of calibration kits for Short, Open and Load as well as a standard adapter calibration kit with different connector standards are thereby required to perform two-port calibration. However, the Thru calibration kit with two different standards is very expensive and further the higher the applicable frequency, the higher the associated cost.

SUMMARY

An exemplary embodiment of the present disclosure illustrates a method for measuring the scatter parameters (S-parameters) of a device under test (DUT) which may measure the S-parameters of the radio frequency (RF) adapter without performing a full two-port calibration using a standard adapter kit, thereby reducing the number of measurements and the requirements of adapters.

According to one exemplary embodiment of the present disclosure, a method for measuring the S-parameters of a DUT, adapted for measuring a DUT having two connectors of different standards, the first connector, and the second connector is illustrated. The measurement methodology includes the following steps: performing a first one-port calibration to the port-1 of the network analyzer to obtain the a set of calibration parameters; connecting the first connector of a DUT to the port-1 of the network analyzer; conducting a second one-port calibration to the port-1 through the second connector of the DUT to obtain a second set of calibration parameters associated with the second connector of the DUT corresponding to a reference plane; computing the S-parameters of the DUT from the first and the second sets of the calibration parameters.

The steps for obtaining the S-parameters of the DUT from the first and second calibration parameters further includes the utilization of the following formula in computing the S-parameters of the DUT:

$$S_{11} = \frac{E'_{DF} - E_{DF}}{E_{RF} + E_{SF}(E'_{DF} - E_{DF})}$$

$$S_{21}S_{12} = \frac{E'_{RF}(1 - E_{SF}S_{11})^2}{E_{RF}}$$

$$S_{22} = E'_{SF} - \frac{E_{SF}S_{21}S_{12}}{1 - E_{SF}S_{11}},$$

wherein, $S_{11}$, $S_{12}$, $S_{21}$, $S_{22}$ represent the S-parameters of the DUT; $E_{DF}$ represents the forward directivity error associated with the first set of calibration parameters and $E'_{DF}$ represents the forward directivity error associated with the second set of calibration parameters; $E_{SF}$ represents the forward source match error associated with the first set of calibration parameters and $E'_{SF}$ represents the forward source match error associated with the second set of calibration parameters; $E_{RF}$ represents the forward reflection tracking error associated with the first set of calibration parameters and $E'_{RF}$ represents the forward reflection tracking error associated with the second set of calibration parameters.

To sum up, the method for measuring the S-parameters of the DUT provided by the present disclosure, utilizes a two one-port calibrations to obtain the S-parameters of the RF adapter. The method does not require an adapter kit (such as 3.5 mm to 2.4 mm Thru kit) nor a full two-port calibration thereby reducing the calibration cost and the amount time needed for conducing measurement.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

Prior to any measurements, a network analyzer must perform calibrations, to collect the systematic error components and then uses the de-embedding techniques to obtain the scatter parameters (S-parameters) of a device under test (DUT). Errors associated with the network analyzer may be classified into three types: the random errors, the drift errors, and the systematic errors. The random errors mainly generated from thermal noises of the instrument as well as connectors, therefore are unpredictable and time-variant errors. Consequently, the current error model may not calibrate the random errors and may only rely on multiple measurements to average out the impacts of the random errors. The drift errors mainly generated from aging of the instrument and temperature drifting, therefore the ambient temperature of the network analyzer may be preferable to be stabilized. Therefore, warming up the instrument after turning on and waiting for the temperature of the instrument to stabilize before starting the measuring process could lead to more accurate measurement results.

The systematic errors mainly coming from the non-ideal characteristics associated with the internal structure of the network analyzer thus the characteristics are repeatable and time-invariant. Since the system itself may be incapable of predicting the time-variant errors such as random errors and the drift errors, consequently may not accurately eliminated these errors. However, the systematic errors may be eliminated through calibrations and mathematically approaches to increase the measurement accuracy of the DUT.

Figure 1:
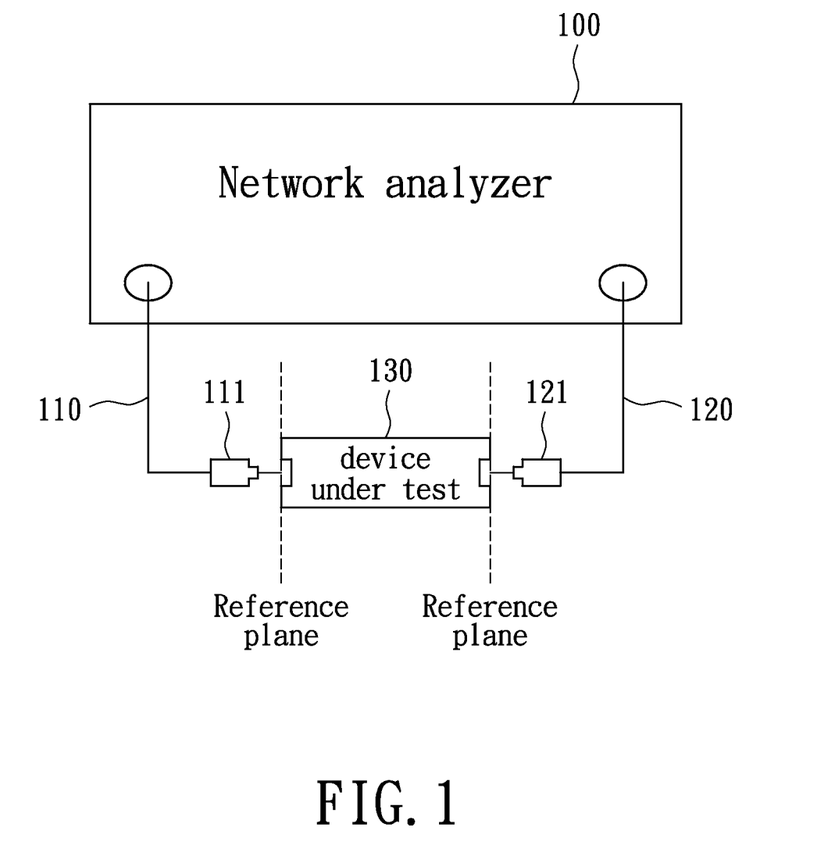
FIG. 1 schematically illustrates an exemplary measurement diagram of a network analyzer.

Calibrations are mainly used for establishing a measurement reference plane, through shifting the reference plane to the front-end of the measuring connectors or the two-ends of the DUT. Further utilized the characterized test fixtures as well as the interconnection effects to eliminate the systematic errors with non-ideal characteristics to reverse-calculate the actual S-parameters of the DUT. Refer to FIG. 1, which schematically illustrates an exemplary measurement diagram of a network analyzer. The network analyzer 100 connects the DUT 130 through high frequency cables 110 and 120, wherein the error sources include the network analyzer 100 as well as the high frequency cables 110 and 120. Consequently, the reference plane of measurement has to be shifted to the front-end of the connectors 111 and 121 of the high frequency cables 110 and 120. The error model established herein may include connections of the network analyzer 100 through the high frequency cables 110 and 120. The actual characteristics of the DUT 130 may be obtained by using the mathematically approaches to eliminate the impacts of the error model (i.e., systematic errors and high frequency cables) from the measurements.

It is worth to note that the standards of the connectors 111 and 112 in the instant exemplary embodiment may include the N-type, the 3.5 mm, the 2.4 mm, the GSG, or etc. Furthermore, the above described FIG. 1 only serves as an exemplary diagram and the present disclosure is not limited thereto.

Figure 2A:
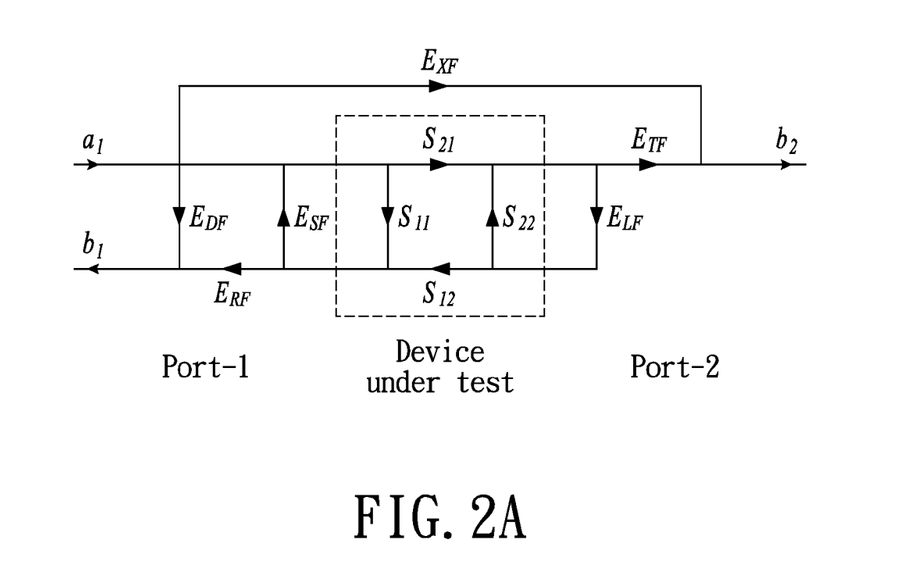
FIG. 2A depicts a schematic diagram of a forward error model.

Taking the two-port Vector Network Analyzer (VNA) as an example, the main calibration method includes SOLT, TRL, TRM/LRM, LRRM, and SOLR. Although the calibration methods and calibration kits are different, however the adopted error models may be identical. Refer to FIG. 2A in conjunction with FIG. 2B, which illustrates an exemplary diagram of a forward error model and a reverse error model, respectively. The systematic error components may include six types according to the error types and the causes thereof which are listed as follow: the directivity error, the source match error, the load match error, the reflection tracking error, the transmission tracking error, and the crosstalk error.

Figure 2B:
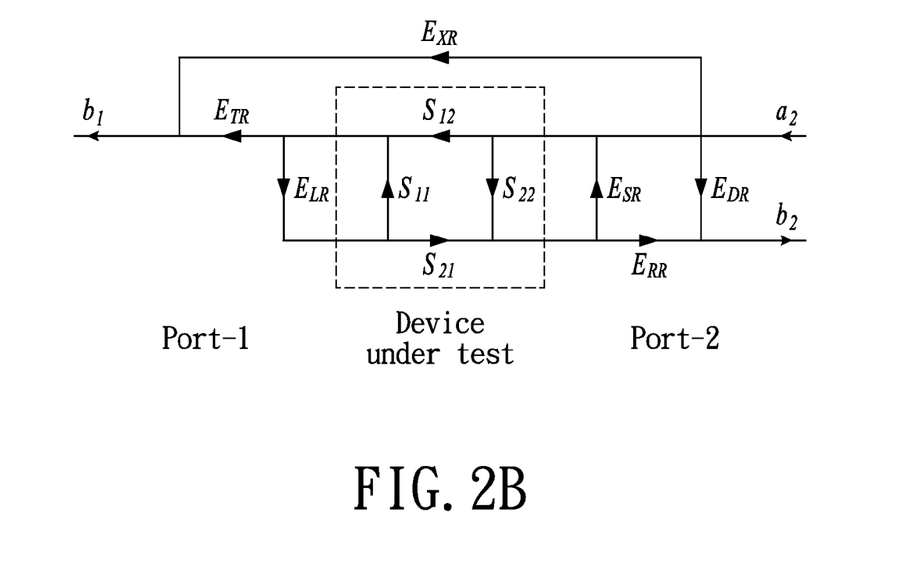
FIG. 2B depicts a schematic diagram of a reverse error model.

Considering a forward and an reverse errors, the error models may be divided into a forward and an reverse error models, for a total of 12 error components, wherein the forward and the reverse error models, each has 6 error components as shown in FIG. 2A and FIG. 2B.

$E_{DF}$ represents the forward directivity error; $E_{DR}$ represents the reverse directivity error. $E_{SF}$ represents the forward source match error; $E_{SR}$ represents the reverse source match error. $E_{LF}$ represents the forward load match error; $E_{LR}$ represents the reverse load match error. $E_{RF}$ represents the forward reflection tracking error; $E_{RR}$ represents the reverse reflection tracking error. $E_{TF}$ represents the forward transmission tracking error; $E_{TR}$ represents the reverse transmission tracking error. $E_{XF}$ represents the forward crosstalk error; $E_{XR}$ represents the reverse crosstalk error.

$S_{11}$, $S_{12}$, $S_{21}$, and $S_{22}$ represent the S-parameters of the DUT. As shown in FIG. 2A, $a_1$ and $b_1$ respectively represent an incident and a reflect signals at port-1. The $b_2$ represents an output signal at the port-2. According to FIG. 2B, $a_2$ and $b_2$ respectively represent an incident and a reflect signals at the port-2. The $b_1$ represents the signal from the DUT to the port-1. Based on the explanation of the aforementioned exemplary embodiment, those skilled in the art should be able to deduce the error components of FIG. 2A and FIG. 2B and the associated definitions, and further description are therefore omitted.

Taking the SOLT calibration as an example, wherein the SOLT includes four calibration kits: Short, Open, Load, and Thru, hence is generally known as the Short-Open-Load-Thru (SOLT) calibration. The calibrations are divided into one-port and two-port calibrations, wherein the one-port calibration utilizes the Short, the Open, and the Load calibration kits to perform calibrations. On the other hand, the two-port calibration utilizes the four calibration kits, i.e., the Short, the Open, the Load, and the Thru to perform calibrations. The main difference between the one-port and the two-port calibrations is whether or not to calibrate using the Thru calibration kit. After completing the calibration, the error models may be established, wherein the error models are generally expressed in array form.

When performing the two-port measurements is required, the one-port calibration must first apply to the two connector ports. The Thru calibration kit is used to conduct two-port calibrations to extrapolate all the error components before conducts the DUT measurements. If the two-end connectors of the DUT are of different standards, then an adapter having two ends of different standards may be required to properly perform the calibration. For instance, when measuring the S-parameters of a 2.4 mm to 3.5 mm adapter, the conventional two-port calibration requires the 2.4 mm to 3.5 mm adapter kit (or 2.4 mm to 3.5 mm Thru kit) in order to perform two-port calibration. However, the Thru kit having different connector standards is quite expensive.

The instant exemplary embodiment illustrates a new method for measuring the S-parameters of the DUT which utilizes two one-port calibrations to obtain the calibration parameters to computes the S-parameters of the DUT. Next, take an adapter having two ends with different connector standards (for example 3.5 mm to 2.4 mm) as an example to further elaborate the techniques described in the instantly disclosed exemplary embodiment.

Figure 3A:
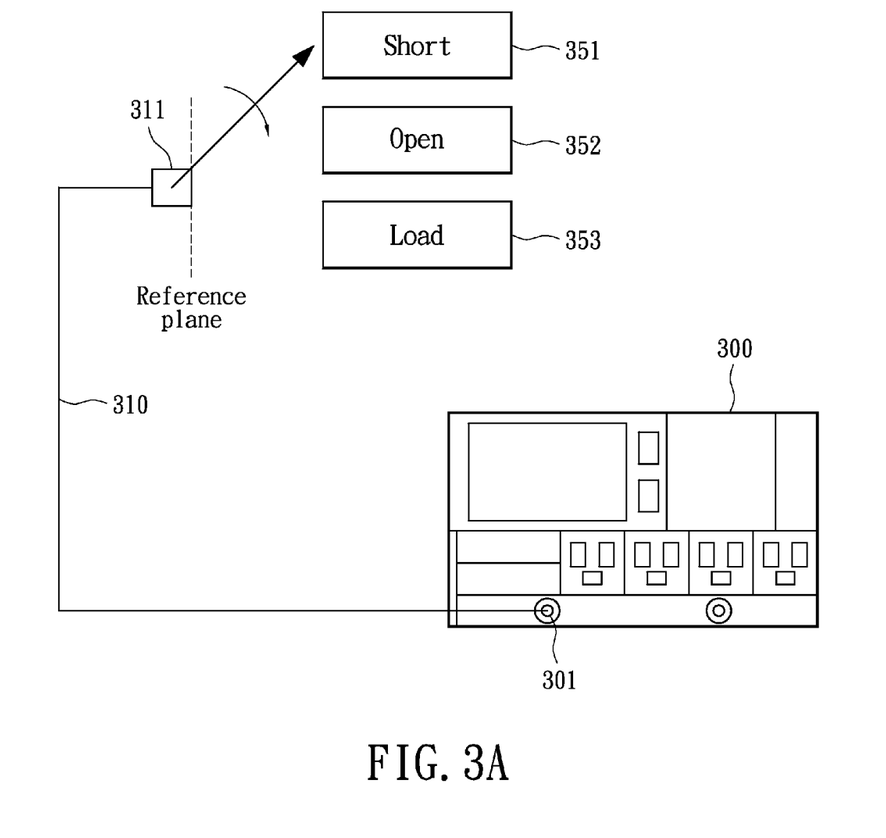
FIG. 3A graphically illustrates a first one-port calibration in accordance with an exemplary embodiment of the present disclosure.

Refer to FIG. 3A, which graphically illustrates a first one-port calibration in accordance with an exemplary embodiment of the present disclosure. As shown in FIG. 3A, conduct one-port calibration to the port-1 301 of the network analyzer 300 by adopting three calibration kits in sequence: the Short calibration kit 351, the Open calibration kit 352, and the Load calibration kit 353. As the port-1 301 of the network analyzer 300 connects the high frequency cable 310, therefore the reference plane of the calibration shifts to the front-end of the connector 311 of the high frequency cable 310 or alternatively the reference plane corresponds to the connector 311 of the high frequency cable 310. The reference plane of the calibration may be in the front of the port-1 301 if the network analyzer 300 is not connected to the high frequency cable 310. The one-port calibration process may be refer to the manual of the network analyzer, further based on the explanation of the aforementioned exemplary embodiment, those skilled in the art should be able to deduce other embodiments and the descriptions are therefore omitted.

The network analyzer 300 may obtain a first set of calibration parameters after performing the first calibration. The calibration parameters may be expressed using the error model shown in FIG. 3B, which schematically illustrates an error model associated with the first set of calibration parameters in accordance with an exemplary embodiment of the present disclosure. The error model 360 includes the forward directivity error $E_{DF}$, the forward source match error $E_{SF}$, and the forward reflection tracking error $E_{RF}$. Comparing FIG. 2A with FIG. 3B, as FIG. 3B describes the one-port calibration error model, therefore does not have take the forward load match error $E_{LF}$, the forward transmission tracking error $E_{TF}$, the forward crosstalk error $E_{XF}$, and the reverse error components into consideration. Since the above excluded error components only need to be taken into consideration when performing the two-port calibration.

Figure 3B:
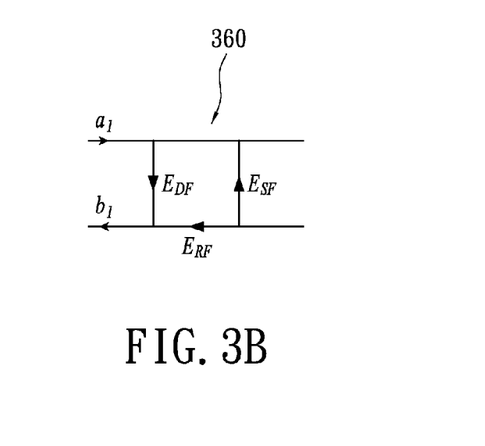
FIG. 3B schematically illustrates an error model associated with the first set of calibration parameters in accordance with an exemplary embodiment of the present disclosure.

The error model 360 includes the characteristics of the high frequency cable 310 and may be used to describe the systematic error of port-1 301. The error model 360 may be stored in the network analyzer 300, and hence only need to pre-load the error model 360 as the calibration parameters, then the network analyzer 300 may obtain the reflection coefficient $S_{11}$ of the DUT through performing one-port measurement through the port-1 301.

It is worth to note that the DUT of the instant exemplary embodiment may for example be a 3.5 mm to 2.4 mm adapter, consequently, the connector standard of the high frequency cable 310 may be a 3.5 mm or a 2.4 mm. Since the high frequency cable 310 in accordance to the instant exemplary embodiment uses a cable with 3.5 mm connector standard for illustration, therefore the Short calibration kit 351, the Open calibration kit 352, and the Load calibration kit 353 adopted in the first one-port calibration shall be the calibration kits with 3.5 mm connectors.

Figure 4A:
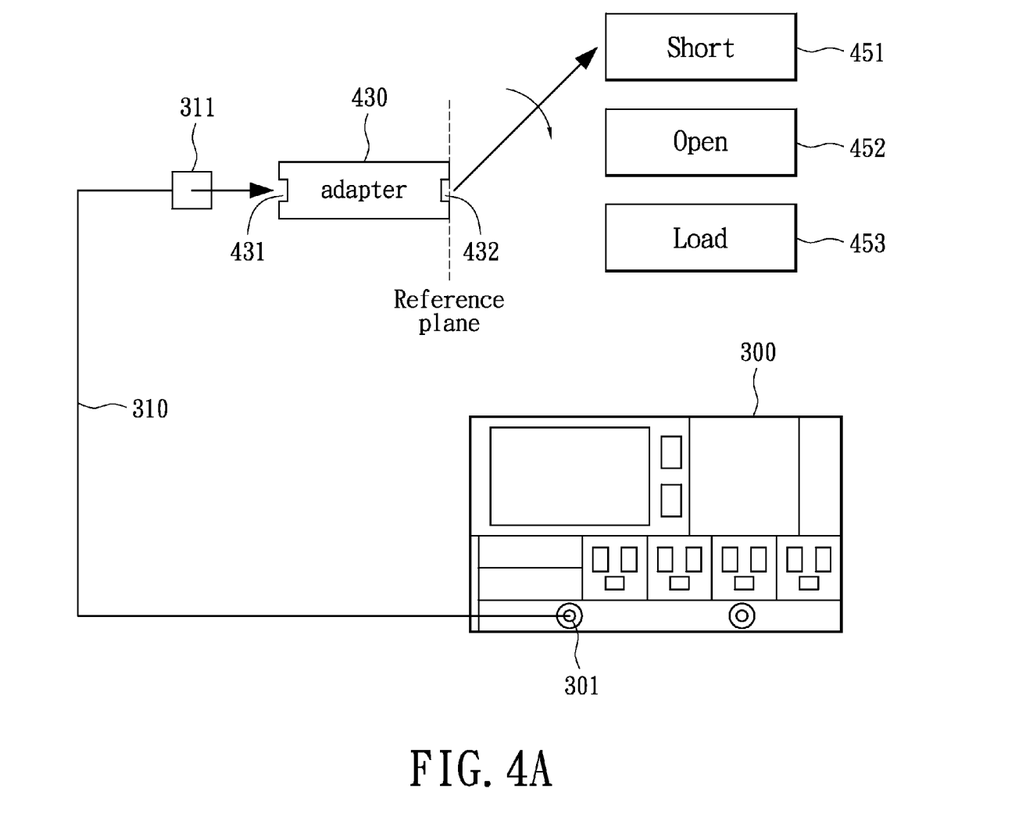
FIG. 4A graphically illustrates a second one-port calibration in accordance with an exemplary embodiment of the present disclosure.

In the instant exemplary embodiment, the first set of calibration parameters (i.e., the error components associated with the error model 360, $E_{DF}$, $E_{SF}$, $E_{LF}$) may be stored before performing the second one-port calibration. As shown in FIG. 4A, which graphically illustrates a second one-port calibration in accordance with an exemplary embodiment of the present disclosure. During the second one-port calibration, a 3.5 mm connector 431 of an adapter 430 may be first connected to the connector 311 of the high frequency cable 310, then perform the one-port calibration through a 2.4 mm connector 432 of the adapter 430. Alternatively, utilizes the Short, the Open, and the Load calibration kits 451, 452, and 453 having 2.4 mm connectors to perform the calibration of the port-1 301.

The network analyzer 300 may obtain a second set of calibration parameters after performing the second one-port calibration. The calibration parameters may be expressed by the error model shown in FIG. 4B, which schematically illustrates an error model of the second set of calibration parameters in accordance with an exemplary embodiment of the present disclosure. Similarly, the error model includes the forward directivity error $E'_{DF}$, the forward source match load $E'_{SF}$, and the forward reflection tracking error $E'_{RF}$. However, the values of the second set of calibration parameters are different from the first set of calibration parameters. Since during the second one-port calibration, the adapter 430 may be included in the entire measurement system, thereby forcing the reference plane shifts to the front-end of the 2.4 mm connector 432 of the adapter 430 consequently, the error components of the second set of calibration parameters may include the characteristics of the adapter 430 and the first set of calibration parameters. Or equivalently, the error model 460 shown in FIG. 4B may be expressed as the combination of the error model 360 and the S-parameters of the adapter 430.

Figure 4B:
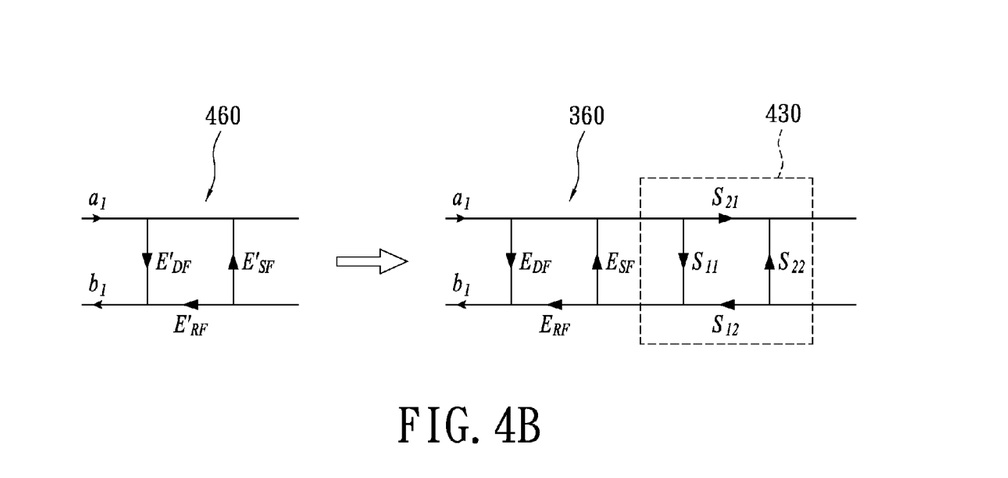
FIG. 4B schematically illustrates an error model of the second set of calibration parameters in accordance with an exemplary embodiment of the present disclosure.

In other words, the S-parameters of the adapter 430 may be obtained by mathematically removing the first set of calibration parameters from the second set of calibration parameters. The above described algorithm may be implemented through an integrated software or hardware in the network analyzer 300 so as to enable the network analyzer 300 to directly perform computations to obtain the S-parameters of the adapter 430. Additionally, the first and the second sets of calibration parameters may also be loaded onto a computer then performing the corresponding algorithm to compute the required parameters.

Further, the following equations may be utilized in performing the above described computations:

$$S_{11} = \frac{E'_{DF} - E_{DF}}{E_{RF} + E_{SF}(E'_{DF} - E_{DF})} \quad (1)$$

$$S_{21}S_{12} = \frac{E'_{RF}(1 - E_{SF}S_{11})^2}{E_{RF}} \quad (2)$$

$$S_{22} = E'_{SF} - \frac{E_{SF}S_{21}S_{12}}{1 - E_{SF}S_{11}} \quad (3)$$

The parameters $S_{11}$, $S_{12}$, $S_{21}$, and $S_{22}$ represent the S-parameters of the adapter 430; $E_{DF}$ represents the forward directivity associated with the first set of calibration parameters and $E'_{DF}$ represents the forward directivity error associated with the second set of calibration parameters; $E_{SF}$ represents the forward source error associated with the first set of calibration parameters and $E'_{SF}$ represents the forward source error associated with the second set of calibration parameters; $E_{RF}$ represents the forward reflection tracking error associated with the first set of calibration parameters and $E'_{RF}$ represents the forward reflection tracking error associated with the second set of calibration parameters.

The S-parameters are complex, therefore $S_{12}S_{21}$ (or $S_{21} \times S_{12}$) of the aforementioned Eq. (1) may take complex form. Consequently, two complex solutions may be obtained by taking the square root of the $S_{21} \times S_{12}$, wherein an argument associated with a complex solution may be very close to the phase change of the DUT (i.e., the adapter 430) and moreover the argument is related to the physical length of the DUT. The complex solution having the argument yields the final solution or equivalently, the complex solution is the $S_{21}$ and $S_{12}$ of the DUT. Since the adapter 430 is the DUT with reciprocal characteristic, $S_{21}$ and $S_{12}$ are thereby equal.

An example is provided herein for clarification:

Supposing the received frequency is 10 GHz, then the $S_{12}S_{21}$ is equal to 0.8∠310° (i.e., magnitude: 0.8; argument: 310°). Consequently, the following solutions may be obtained after taking the square root:

$$S_{21} = S_{12} = 0.894 \angle 335° \text{ or } 0.894 \angle 155°$$

Further, supposing the physical length of the DUT, L=3 cm, the relative permittivity $\epsilon_r$=2, and the parameter C represents the speed of light. The phase change may therefore be estimated by plugging the above described parameters into the following expression:

$$\frac{L}{C/\sqrt{\varepsilon_r}} \times f \times 360° = 149°$$

After comparison, one complex solution with an argument of 155° closes to the estimated phase of 149° is found, thereby obtaining that $S_{21}=S_{12}=0.894 \angle 155°$.

Alternatively, the arguments of parameters $S_{12}$ and $S_{21}$ are related to the physical length of the DUT (i.e., the adapter 430), thus the correct value may be obtained using the physical length of the DUT. Based on the explanation of the aforementioned exemplary embodiment, those skilled in the art should be able to deduce the derivations for the aforementioned equations and the descriptions are therefore omitted.

In addition, it is worth to note that there is no need to pre-load the previous calibration parameters data (or the calibration file) when performing the first and the second one-port calibrations. In other words, the methodology illustrated in the present disclosure is to directly utilizing two network analyzer 300 calibrations to obtain all the S-parameters of the DUT instead of using the calibrated network analyzer 300 to measure the DUT. It may be noted that the order of the above described first and second one-port calibration may be interchangeable. Or equivalently, the second set of calibration parameters may be obtained prior to the first set of calibration parameters. The order adopted in obtaining the calibration parameters does not affect the accuracy of parameters of the DUT.

Moreover, it may be noted that the DUT must be a reciprocal component, for example an adapter with different interfaces, such as 3.5 mm to 2.4 mm, GSG to 3.5 mm, or N-type to 3.5 mm. In addition to the adapters, the disclosed measurement method may be adapted to other types of reciprocal components such as resistor, inductors, or Thru calibration kits. Based on the explanation of the aforementioned exemplary embodiment, those skilled in the art should be able to deduce other types of the DUT and further descriptions are therefore omitted.

In another exemplary embodiment, the forgoing described high frequency cable 310 of FIG. 3A and FIG. 4A may adopt a 2.4 mm connector or connect to a GSG probe so as to measure DUTs of different standards. However, different connectors or probes may require different calibration kits in order to properly perform calibrations. Based on the explanation of the aforementioned exemplary embodiment those skilled in the art should be able to deduce other embodiments and the descriptions are therefore omitted.

Figure 5:
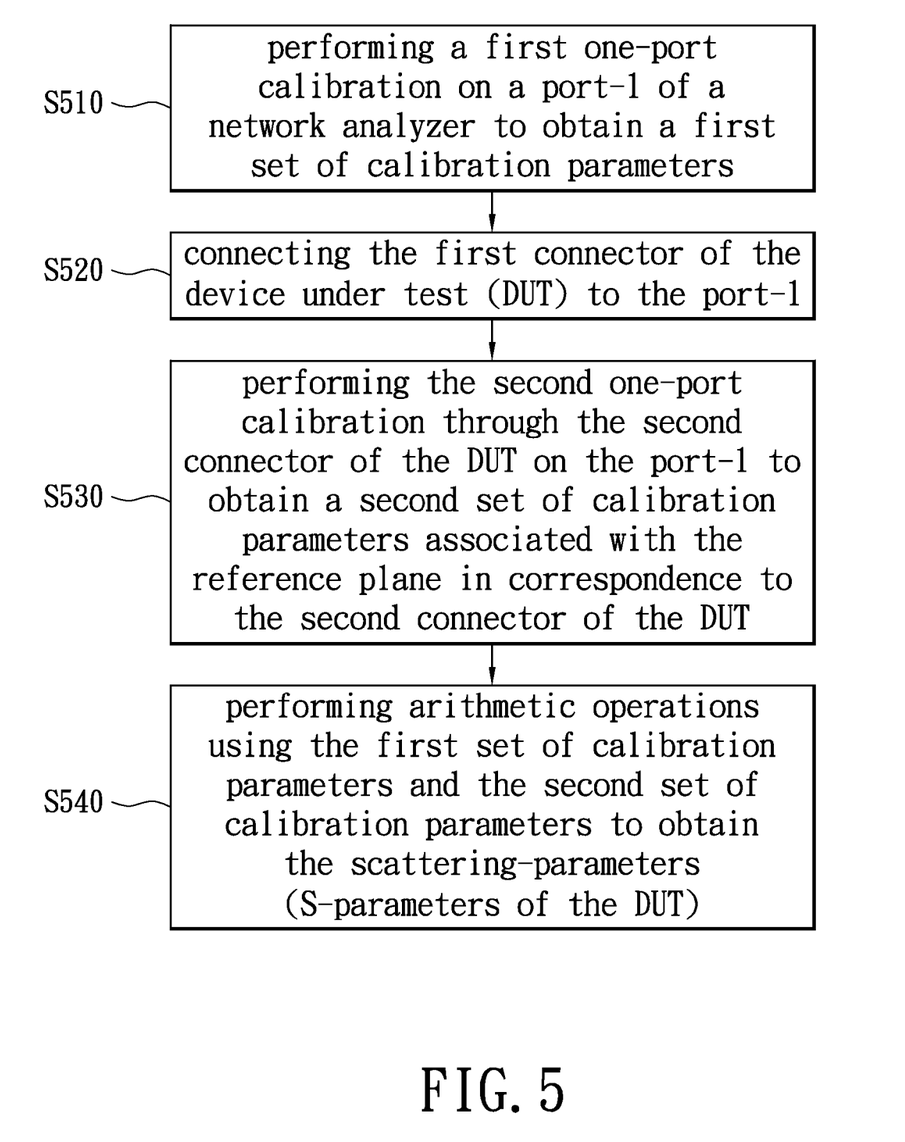
FIG. 5 is a flowchart illustrating an exemplary method of measuring the scattering parameters (S-parameters) of a device under test (DUT) in accordance with an exemplary embodiment of the present disclosure.

Based on the aforementioned embodiments, a method of measuring the S-parameters of the DUT may be summarized as shown in FIG. 5. FIG. 5 shows a flowchart illustrating an exemplary method of measuring the S-parameters of a DUT in accordance with an exemplary embodiment of the present disclosure. Performing a first one-port calibration to a port-1 of the network analyzer to obtain the first set of calibration parameters (S510). Next, connecting a first connector of the DUT to the port-1 as shown in FIG. 4 (S520). Performing the second port-1 calibration through a second connector of the DUT to obtain the second set of calibration parameters associated with a reference plane in correspondence to the second connector of the DUT (S530). Then obtain the S-parameters of the DUT through performing series of calculations using the first and the second sets of calibration parameters (S540).

Then the S-parameters of the DUT may be obtained through applying series of arithmetic operations to the first and the second sets of calibration parameters (S540), wherein the arithmetic operations algorithm are as above described equations (1), (2) and (3) and the descriptions are therefore omitted.

The order of the above described steps S510 and S520, S530 may be interchangeable, however as it should be noted that prior to the calibration step S510, the DUT should be removed in order to perform proper one-port calibration of the network analyzer. Refer to the elaboration of the aforementioned exemplary embodiments for further details regarding the method described above for measuring the S-parameters of the DUT. Based on the explanation of the aforementioned exemplary embodiment, those skilled in the art should be able to deduce other embodiments and the descriptions are therefore omitted.

When conducting measurements on a high frequency adapter, a SOLT calibration kit of two standards and an adapter kit having same interface as the high frequency adapter are required by the conventional measuring method. The two sets standard SOLT and the adapter kit are then used to performing the two-port calibration so as to obtain the calibration parameters. Further, the calibration parameters have to be loaded onto the measurement instrument before the S-parameters of the adapter may be measured. In comparison to the conventional method, the measuring method illustrated by the present disclosure only requires two SOL one-port calibrations. In other words, the number of measurements required is reduced, thereby shortening the measurement period. Further, the present disclosure may obtain the S-parameters of the DUT without the need of an adapter kit, hence requires fewer calibration components thus reduce the cost of performing calibration.

In summary, the measuring method illustrated by the present disclosure may conveniently measures the S-parameters of a high frequency adapter of different interfaces since the method does not require the use of an adapter kit (e.g., 2.4 mm to 3.5 mm Thru calibration kit) and moreover only requires SOLT calibration kit of two standards. In addition, the conventional measuring method requires an adapter kit and multiple calibrations while the measuring method illustrated by the present disclosure requires fewer measuring steps and calibration kits thereby efficiently reducing the measurement period as well as the cost of calibration.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A method of measuring scattering parameters (S-parameters) of a device under test (DUT), adapted for measuring a DUT having a first connector and a second connector, comprising:

performing a first one-port calibration on a port-1 of a network analyzer to obtain a first set of calibration parameters;

connecting the first connector of the DUT to the port-1 and performing a second one-port calibration through the second connector of the DUT on the port-1 to obtain a second set of calibration parameters associated with a reference plane in correspondence to the second connector of the DUT; and performing arithmetic operations using the first set of calibration parameters and the second set of calibration parameters to obtain the S-parameters of the DUT.

2. The method of measuring the S-parameters of the DUT according to claim 1, wherein the DUT is an adapter having the first and the second connectors of different standards.

3. The method of measuring the S-parameters of the DUT according to claim 1, wherein the process of performing arithmetic operations using the first set of calibration parameters and the second set of calibration parameters to obtain the S-parameters of the DUT further comprises of using the following formula to compute the S-parameters of DUT:

$$S_{11} = \frac{E'_{DF} - E_{DF}}{E_{RF} + E_{SF}(E'_{DF} - E_{DF})};$$

$$S_{21}S_{12} = \frac{E'_{RF}(1 - E_{SF}S_{11})^2}{E_{RF}}; \text{ and}$$

$$S_{22} = E'_{SF} - \frac{E_{SF}S_{21}S_{12}}{1 - E_{SF}S_{11}};$$

wherein the parameters S11, S12, S21, and S22 represent the S-parameters of the DUT; EDF representing the forward directivity error associated with the first set of calibration parameters and E'DF representing the forward directivity error associated with the second set of calibration parameters; ESF representing the forward source error associated with the first set of calibration parameters and E'SF representing the forward source error associated with the second set of calibration parameters; ERF representing the forward reflection tracking error associated with the first set of calibration parameters and E'RF representing the forward reflection tracking error associated with the second set of calibration parameters.

4. The method of measuring the S-parameters of the DUT according to claim 1, wherein the process of performing arithmetic operations using the first set of calibration parameters and the second set of calibration parameters to obtain the S-parameters of the DUT further comprises mathematically removing the first set of calibration parameters from the second set of calibration parameters to obtain the S-parameters of the DUT.

5. The method of measuring the S-parameters of the DUT according to claim 1, wherein performing the first one-port calibration on the port-1 of the network analyzer to obtain the first set of calibration parameters further comprises of utilizing a first Short calibration kit, a first Open calibration kit, and a first Load calibration kit, with each being adaptable to port-1 in the one-port calibration of the network analyzer.

6. The method of measuring the S-parameters of the DUT according to claim 5, wherein performing the second one-port calibration on the port-1 of the network analyzer further comprises of utilizing a second Short calibration kit, a second Open calibration kit, and a second Load calibration kit, with each being adaptable to the second connector of the DUT in the one-port calibration of the network analyzer.

7. The method of measuring the S-parameters of the DUT according to claim 1, wherein the first set of calibration parameters comprises of three systematic error components and the three systematic error components further comprise of a forward directivity error, a forward source match error, and a forward reflection tracking error.

8. The method of measuring the S-parameters of the DUT according to claim 1, wherein the second set of calibration parameters comprises of three systematic error components and the three systematic error components further comprise of a forward directivity error, a forward source match error, and a forward reflection tracking error, wherein these systematic errors components comprises the characteristics of the DUT.

9. The method of measuring the S-parameters of the DUT according to claim 1, wherein the network analyzer performs the first and the second one-port calibrations to obtain the first and the second sets of calibration parameters without preloaded the calibration parameters.

* * * * *